(12) United States Patent
Yu (10) Patent No.: US 11,990,398 B2
(45) Date of Patent: May 21, 2024

(54) SEMICONDUCTOR PACKAGE DEVICE HAVING CHIP SUBSTRATE WITH PADS AROUND PHOTOSENSITIVE REGION

(71) Applicant: TONGFU MICROELECTRONICS CO., LTD., Nantong (CN)

(72) Inventor: Guoqing Yu, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 354 days.

(21) Appl. No.: 17/317,062

(22) Filed: May 11, 2021

(65) Prior Publication Data
US 2021/0265252 A1  Aug. 26, 2021

Related U.S. Application Data

(63) Continuation of application No. PCT/CN2019/082309, filed on Apr. 11, 2019.

(30) Foreign Application Priority Data

Nov. 12, 2018 (CN) .......................... 201811341256.3
Nov. 12, 2018 (CN) .......................... 201811341982.5

(51) Int. Cl.
*H01L 23/498* (2006.01)
*H01L 21/48* (2006.01)
*H01L 21/78* (2006.01)

(52) U.S. Cl.
CPC ...... *H01L 23/49827* (2013.01); *H01L 21/486* (2013.01); *H01L 21/78* (2013.01); *H01L 23/49838* (2013.01); *H01L 23/49894* (2013.01)

(58) Field of Classification Search
CPC . H01L 23/49827; H01L 21/486; H01L 21/78; H01L 23/49838; H01L 23/49894
See application file for complete search history.

(56) References Cited

U.S. PATENT DOCUMENTS

2012/0156823 A1* 6/2012 Myung ................ H01L 21/78
257/E31.11
2012/0307515 A1* 12/2012 Fukui ...................... F21K 2/00
362/556
(Continued)

FOREIGN PATENT DOCUMENTS

CN   101814445 A   8/2010
CN   104078479 A   10/2014
(Continued)

OTHER PUBLICATIONS

World Intellectual Property Organization (WIPO) International Search Report for PCT/CN2019/082309 dated Aug. 5, 2019 5 Pages.

*Primary Examiner* — Michael Jung
(74) *Attorney, Agent, or Firm* — Anova Law Group, PLLC (57) ABSTRACT

A semiconductor packaging method and a semiconductor package device are provided. The packaging method includes providing a chip. The chip includes a chip substrate having a front surface and a back surface, where the front surface includes a photosensitive region; pads disposed at the front surface of the chip substrate and around the photosensitive region; and a transparent protection layer over the front surface of the chip substrate, where the transparent protection layer covers the photosensitive region and the pad. The packaging method also includes forming through-holes in the chip substrate at positions corresponding to the pads from the back surface of the chip substrate, where the pads one-to-one correspond to the through-holes and are exposed from the through-holes. Further, the packaging method includes electrically connecting each pad of the chip to a circuit board through a metal rewiring layer in a corresponding through-hole.

17 Claims, 5 Drawing Sheets

(56) References Cited

U.S. PATENT DOCUMENTS

| | | |
|---|---|---|
| 2013/0328147 A1 | 12/2013 | Ho et al. |
| 2016/0071816 A1* | 3/2016 | Huang ................ H01L 21/6835 |
| | | 257/738 |
| 2016/0212852 A1 | 7/2016 | Hu et al. |

FOREIGN PATENT DOCUMENTS

| | | |
|---|---|---|
| CN | 109524479 A | 3/2019 |
| CN | 109545809 A | 3/2019 |

* cited by examiner

SEMICONDUCTOR PACKAGE DEVICE HAVING CHIP SUBSTRATE WITH PADS AROUND PHOTOSENSITIVE REGION

CROSS-REFERENCE TO RELATED APPLICATIONS

This application is a continuation application of PCT Patent Application No. PCT/CN2019/082309, filed on Apr. 11, 2019, which claims the priority of Chinese patent applications No. 201811341256.3, filed on Nov. 12, 2018; and No. 201811341982.5, filed on Nov. 12, 2018, the entirety of all of which is incorporated herein by reference.

FIELD OF THE DISCLOSURE

The present disclosure generally relates to the field of semiconductor manufacturing technology and, more particularly, relates to a semiconductor packaging method and a semiconductor package device.

BACKGROUND

A chip with a photosensitive region is a very important part of a camera device. To protect the photosensitive region of the chip, a commonly used packaging method includes providing a transparent glass cover above the photosensitive region of the chip to protect the photosensitive region of the chip.

On the one hand, because the transparent glass cover is often thick, when passing through the transparent glass, light undergoes refraction, reflection and energy loss, which makes the photosensitive effect of the chip worse. On the other hand, the transparent glass cover is connected with the chip by glue. After a long time of use, the glue tends to fall off, and external dust easy enters the photosensitive region of the chip, which further affects the photosensitive effect of the chip. The disclosed packaging method and package device are directed to solve one or more problems set forth above and other problems in the art.

BRIEF SUMMARY OF THE DISCLOSURE

One aspect of the present disclosure includes a semiconductor packaging method. The packaging method includes providing a chip. The chip includes a chip substrate having a front surface and a back surface, where the front surface includes a photosensitive region; pads disposed at the front surface of the chip substrate and around the photosensitive region; and a transparent protection layer over the front surface of the chip substrate, where the transparent protection layer covers the photosensitive region and the pad. The packaging method also includes forming through-holes in the chip substrate at positions corresponding to the pads from the back surface of the chip substrate, where the pads one-to-one correspond to the through-holes and are exposed from the through-holes. Further, the packaging method includes electrically connecting each pad of the chip to a circuit board through a metal rewiring layer in a corresponding through-hole.

Optionally, providing the chip includes providing a wafer. The wafer contains a plurality of chip substrates arranged in a matrix, and a dicing groove is formed between adjacent chip substrates of the plurality of chip substrates. The wafer has a front surface and a back surface, the front surface of the wafer is the front surface of the chip substrate, and the back surface of the wafer is the back surface of the chip substrate. The photosensitive region and the pads disposed around the photosensitive region are disposed over the front surface of the chip substrate. Providing the chip also includes forming the transparent protection layer over the front surface of the wafer, where the transparent protection layer covers the photosensitive region and the pads on each chip substrate. Further, providing the chip includes cutting the wafer and the transparent protection layer along the dicing groove, to obtain a plurality of single chips.

Optionally, the transparent protection layer is formed by forming a transparent protection film over the front surface of the chip substrate by spin coating, dispensing or printing, and curing the transparent protection film to form the transparent protection layer.

Optionally, curing the transparent protection film includes an ultraviolet irradiation, or a high-temperature baking.

Optionally, before forming the through-holes in the chip substrate at the positions corresponding to the pads from the back surface of the chip substrate, the method further includes providing a substrate on a side of the transparent protection layer away from the chip substrate; and polishing the back surface of the chip substrate to make the chip substrate have a thickness less than or equal to a predetermined thickness.

Optionally, forming the through-holes in the chip substrate at the positions corresponding to the pads from the back surface of the chip substrate includes flipping the chip substrate, and forming the through-holes in the chip substrate at the positions corresponding to the pads from the back surface of the chip substrate, where all or part of each pad is exposed from a corresponding through-hole.

Optionally, a size of the through-hole is uniform from a side at the pad to the back surface of the chip substrate, or the size of the through-hole gradually increases from the side at the pad to the back surface of the chip substrate.

Optionally, electrically connecting each pad of the chip to the circuit board through the metal rewiring layer in the corresponding through-hole includes forming the metal rewiring layer in the corresponding through-hole, where one end of the metal rewiring layer is electrically connected to the pad of the chip, and another end of the metal rewiring layer is electrically connected to the circuit board.

Optionally, forming the metal rewiring layer in the corresponding through-hole includes: forming a first mask layer on the back surface of the chip substrate and a surface of the through-hole, and forming a first opening in the first mask layer at a position corresponding to the pad; forming a first seed layer on a surface of the first mask layer away from the chip substrate; forming a second mask layer on a surface of the first seed layer away from the chip substrate, and forming a second opening in the second mask layer above the pad; forming the metal rewiring layer in the second opening; and removing the second mask layer and the first seed layer outside the metal rewiring layer.

Optionally, after removing the second mask layer and the first seed layer outside the metal rewiring layer, the method further includes forming a first barrier layer on a surface of the metal rewiring layer facing away from the pads, and forming a third opening in the first barrier layer; and forming a solder ball in the third opening, and electrically connecting the solder ball with the circuit board.

Another aspect of the present disclosure includes a semiconductor package device. The semiconductor package device includes a chip substrate having a front surface and a back surface, where the front surface includes a photosensitive region. The device also includes pads disposed at the front surface of the chip substrate and around the photosensitive region, where the chip substrate contains through-holes at positions corresponding to the pads, and the through-holes one-to-one correspond to the pads. In addition, the device includes a transparent protection layer disposed over the front surface of the chip substrate and covering the photosensitive region and the pads. Further, the method includes a circuit board electrically connected to each pad through a metal rewiring layer in a corresponding through-hole.

Optionally, the transparent protection layer is formed by spin coating, dispensing or printing.

Optionally, the transparent protection layer is made of a material capable of being cured by an ultraviolet irradiation or a baking.

Optionally, the transparent protection layer is made of a material including one or more of an inorganic transparent material and an organic transparent material. The inorganic transparent material includes at least one of silicon nitride and silicon oxynitride, and the organic transparent material includes polysiloxane.

Optionally, a size of the through-hole is uniform from a side at the pad to the back surface of the chip substrate.

Optionally, a size of the through-hole gradually increases from a side at the pad to the back surface of the chip substrate.

Optionally, the metal rewiring layer is disposed over the back surface of the chip substrate and extended into the through-hole, and one end of the metal rewiring layer is electrically connected to the pad, and another end of the metal rewiring layer is electrically connected to the circuit board.

Optionally, the device further includes a first mask layer disposed between the back surface of the chip substrate and the metal rewiring layer, where the first mask layer contains a first opening at a position corresponding to the pad; and a first seed layer disposed between the first mask layer and the metal rewiring layer, where the pad, the first seed layer, and the metal rewiring layer are electrically connected to each other.

Optionally, the device further includes a first barrier layer disposed on a side of the metal rewiring layer away from the pads, where the first barrier layer contains a third opening; and a solder ball disposed in the third opening and electrically connecting the metal rewiring layer with the circuit board.

Optionally, the device further includes a first barrier layer disposed on a side of the metal rewiring layer away from the pads, where the first barrier layer contains a third opening; a second seed layer disposed on a side of the first barrier layer away from the pads and covering the third opening; an under-ball metal layer disposed on a side of the second seed layer away from the pads; and a solder ball disposed on a side of the under-ball metal layer away from the pads. The solder ball, the under-ball metal layer, the second seed layer, and the metal rewiring layer are electrically connected to each other.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
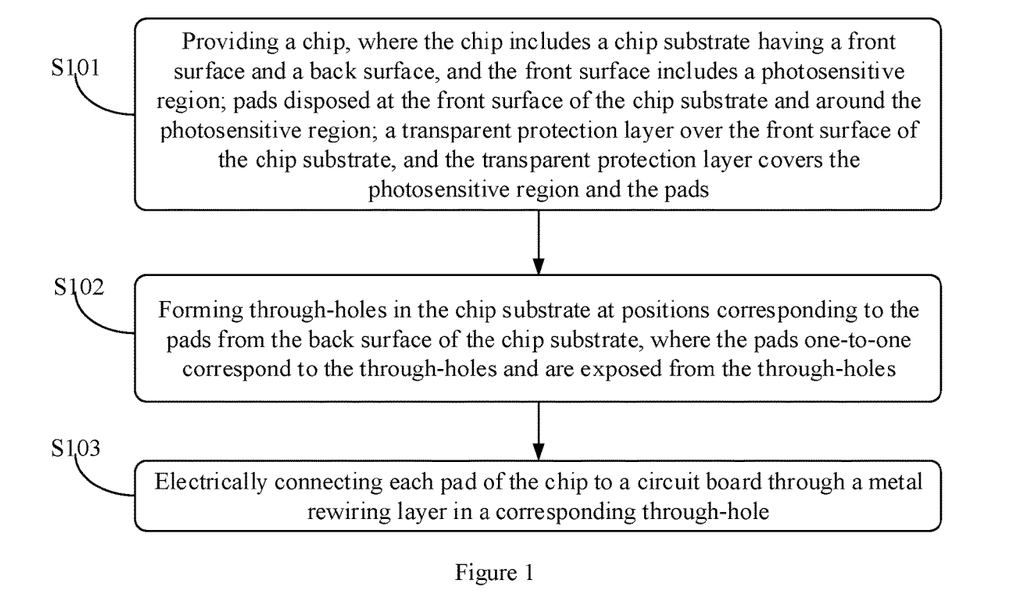
FIG. 1 illustrates a schematic flowchart of an exemplary semiconductor packaging method consistent with various disclosed embodiments of the present disclosure.

FIG. 1 illustrates a schematic flowchart of a semiconductor packaging method consistent with various disclosed embodiments of the present disclosure. Referring to FIG. 1, the packaging method may include following.

In S101: providing a chip. The chip may include a chip substrate. The chip substrate may have a front surface and a back surface, and the front surface may include a photosensitive region. The chip may also include pads disposed at the front surface of the chip substrate and around the photosensitive region. Further, the chip may include a transparent protection layer over the front surface of the chip substrate. The transparent protection layer may cover the photosensitive region and the pads.

Specifically, the photosensitive region of the chip may be an important part of a semiconductor package device. If the photosensitive region is exposed, external particles may easily pollute the photosensitive region and affect the imaging effect of the photosensitive region. Therefore, it may be necessary to protect the photosensitive region of the chip.

Figure 2:
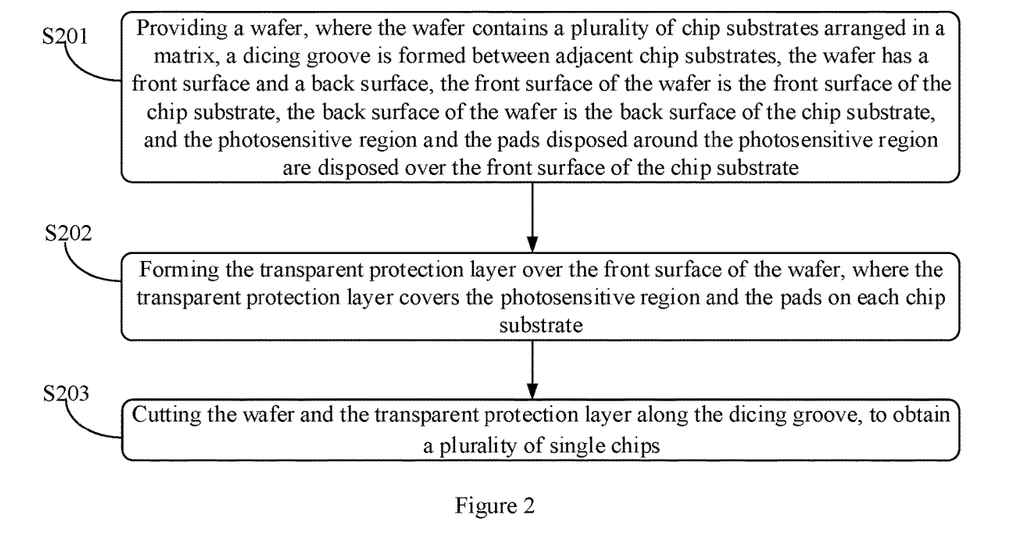
FIG. 2 illustrates a schematic flowchart of a step S101 in FIG. 1 consistent with various disclosed embodiments of the present disclosure.
Figure 3A:
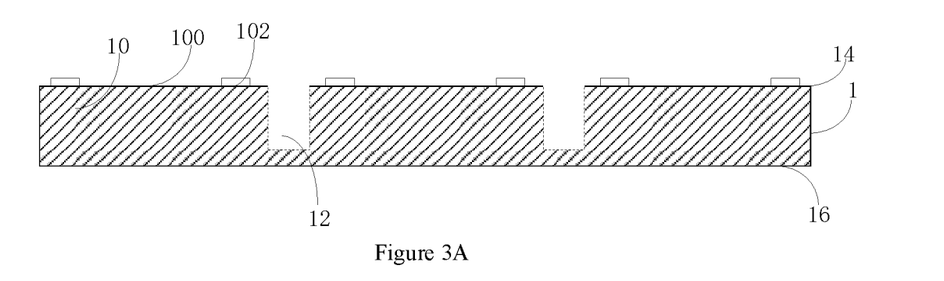
FIGS. 3A-3C illustrate schematic diagrams of semiconductor structures of an exemplary semiconductor package device corresponding to certain stages of steps S201-S203 in FIG. 2 consistent with various disclosed embodiments of the present disclosure.
Figure 3B:
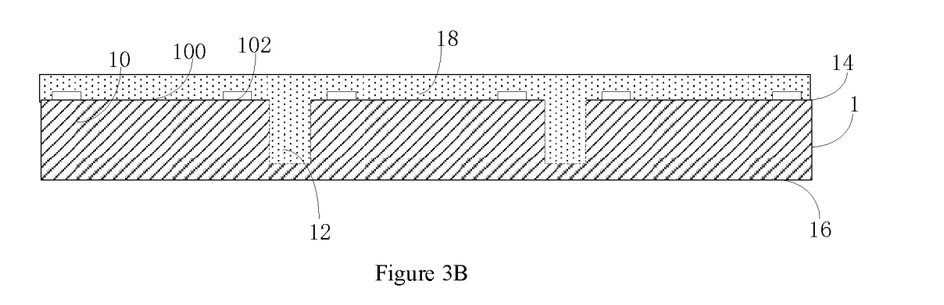
Figure 3C:
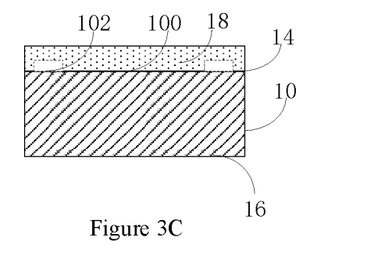

FIG. 2 illustrates a schematic flowchart of a step S101 in FIG. 1; and FIGS. 3A-3C illustrate schematic diagrams of semiconductor structures of a semiconductor package device corresponding to certain stages of steps S201-S203 in FIG. 2. In one embodiment, referring to FIG. 2 and FIGS. 3A-3C, the above step S101 may include following.

In S201: providing a wafer 1. Referring to FIG. 3A, the wafer 1 may contain a plurality of chip substrates arranged in a matrix, and a dicing groove 12 may be formed between adjacent chip substrates. The wafer 1 may have a front surface 14 and a back surface 16. The front surface 14 of the wafer 1 may be the front surface 14 of the chip substrate 10, and the back surface 16 of the wafer 1 may be the back surface 16 of the chip substrate 10. The front surface of the chip substrate may include the photosensitive region 100, and the pads 102 around the photosensitive region 100 may be disposed at the front surface 14 of the chip substrate 10.

In S202: forming a transparent protection layer 18 over the front surface 14 of wafer. The transparent protection layer 18 may cover the photosensitive region 100 and the pads 102 on each chip substrate.

Specifically, in one embodiment, referring to FIG. 3B, the transparent protection layer 18 may also cover the region corresponding to the dicing groove 12. In another embodiment, the transparent protection layer 18 may merely cover the photosensitive region 100 and the pads 102, and may not cover or partially cover the region corresponding to the dicing groove 12.

In another embodiment, forming the transparent protection layer 18 may include: forming a transparent protection film over the front surface 14 of the wafer 1 by spin coating, dispensing or printing, and curing the transparent protection film to form the transparent protection layer 18. A thickness of the transparent protection layer 18 formed by the above method may reach the micron level. Compared with the traditional method of providing a transparent glass, the thickness of the transparent protection layer 18 may be less than the thickness of the transparent glass, which may reduce refraction, reflection and energy loss of the light, and may improve the photosensitive effect of the chip.

In one embodiment, the transparent protection layer 18 may be made of an inorganic transparent material, such as silicon nitride, silicon oxynitride, etc. In another embodiment, the transparent protection layer 18 may be made of an organic transparent material, such as polysiloxane. Curing the transparent protection film may include an ultraviolet irradiation or a high-temperature baking, which may be determined according to the initiator added to prepare the transparent protection layer 18. If the initiator is a photo-initiator (e.g., 2-hydroxy-2-methyl-1-phenylacetone, 1-hydroxycyclohexyl phenyl ketone, etc.), the ultraviolet radiation method may be used. If the initiator is a thermal initiator (e.g., benzoyl peroxide, etc.), the high-temperature baking method may be used.

In S203: cutting the wafer 1 and the transparent protection layer 18 along the dicing groove 12, to obtain a plurality of single chips, as shown in FIG. 3C.

Specifically, cutting the wafer 1 and the transparent protection layer 18 along the dicing groove 12 may be any one method in the prior art, which may not be described in detail herein.

In the above embodiment, the transparent protection layer 18 may be first formed over the wafer 1, and then the plurality of single chips may be obtained by cutting. In another embodiment, the wafer 1 may be first cut to form single chips, and then the transparent protection layer 18 may be formed on the single chips one by one, which may not be limited by the present disclosure.

Figure 4A:
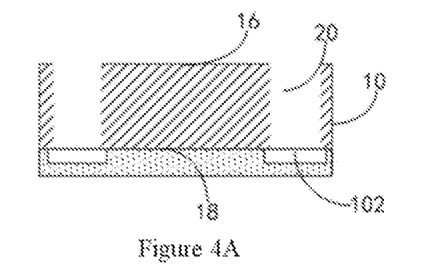
FIGS. 4A-4I illustrate schematic diagrams of semiconductor structures of an exemplary semiconductor package device corresponding to certain stages of steps S102-S103 in FIG. 1 consistent with various disclosed embodiments of the present disclosure.

In S102: forming through-holes 20 in the chip substrate 10 at positions corresponding to the pads 102 from the back surface 16 of the chip substrate 10. The pads 102 may one-to-one correspond to the through-holes 20, such that the pads 102 may be exposed from the through-holes 20.

Specifically, in one embodiment, before the step S102, the method may further include: providing a substrate on a side of the transparent protection layer 18 away from the chip substrate 10; and polishing the back surface 16 of the chip substrate 10 to make the chip have a thickness less than or equal to the predetermined thickness. Specifically, the side of the transparent protection layer 18 away from the chip substrate 10 may be fixed to the substrate by a removable adhesive film, etc. In addition, the wafer directly taken from the packaging and testing factory may often have a substantially large thickness. Therefore, in one embodiment, the back surface 16 of the chip substrate 10 may need to be polished to make the chip have a thickness less than or equal to the predetermined thickness. For example, the predetermined thickness may be approximately 100 µm, and the thickness of the polished chip substrate 10 may be approximately 50 µm, 60 µm, or 80 µm, etc.

In another embodiment, referring to FIG. 4A, the chip substrate 10 may often be made of silicon. Because silicon has poor electrical conductivity, to achieve the electrical connection between the pads 102 and a subsequent circuit board, the through-holes 20 may be formed in the chip substrate 10 from the back surface of the chip substrate 10. In one embodiment, the chip substrate 10 may be flipped, and then the through-holes 20 may be formed in the chip substrate 10 at the positions facing opposite to the pads 102. In one embodiment, the through-holes 20 may be formed in the chip substrate 10 at positions corresponding to the pads 102 by a plasma etching process, and all or part of each pad 102 may be exposed from a corresponding through-hole 20. In another embodiment, the through-holes 20 may be formed by any other suitable method, which may not be limited by the present disclosure.

In addition, a passivation layer, such as silicon dioxide, may be formed on the side where the pad 102 is in contact with the front surface of the chip substrate 10. After forming the through-holes 20, a second etching process may be required to remove the passivation layer on the pad 102. In another embodiment, the through-hole 20 may have a uniform size from a side at the pad 102 to the back surface 16 of the chip substrate 10. In another embodiment, the size of the through-hole 20 may be in any other ways. For example, the size of the through-hole 20 may gradually increase from the side at the pad 102 to the back surface 16 of the chip substrate 10, and all or part of each pad 102 may be exposed from the corresponding through-hole 20.

Figure 4B:
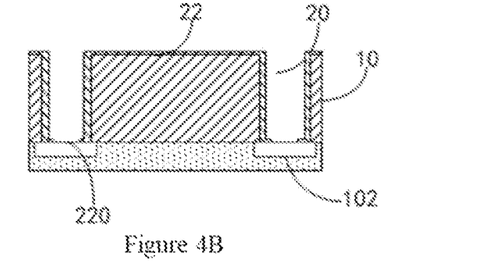
Figure 4C:
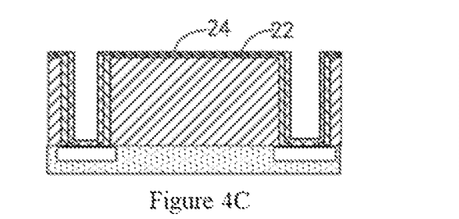
Figure 4D:
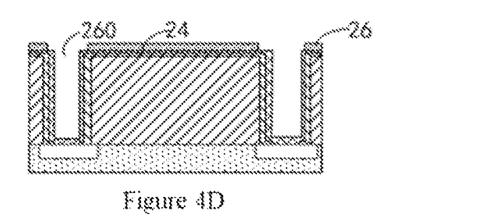
Figure 4E:
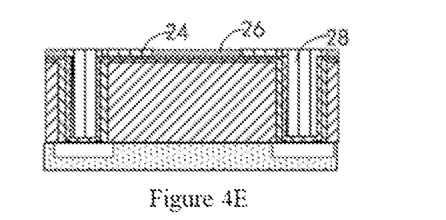
Figure 4F:
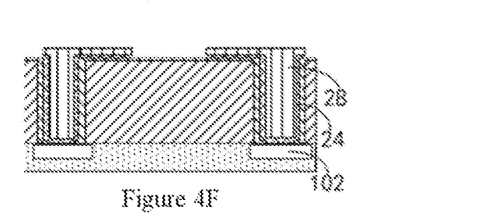
Figure 4G:
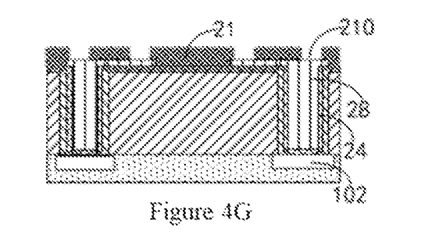
Figure 4H:
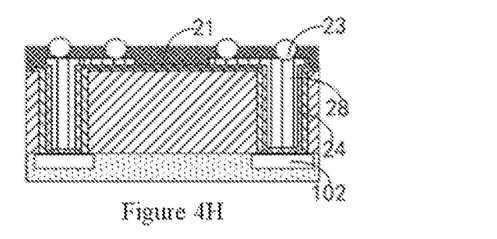
Figure 4I:
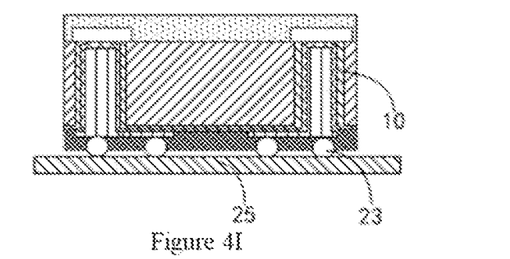

In S103: electrically connecting each pad 102 of the chip to a circuit board 25 through a metal rewiring layer in the corresponding through-hole 20.

Specifically, in one embodiment, the above step S103 may specifically include forming the metal rewiring layer 28 in the corresponding through-hole 20. One end of the metal rewiring layer 28 may be electrically connected to the pad 102 of the chip, and another end of the metal rewiring layer 28 may be electrically connected to the circuit board 25.

Figure 5:
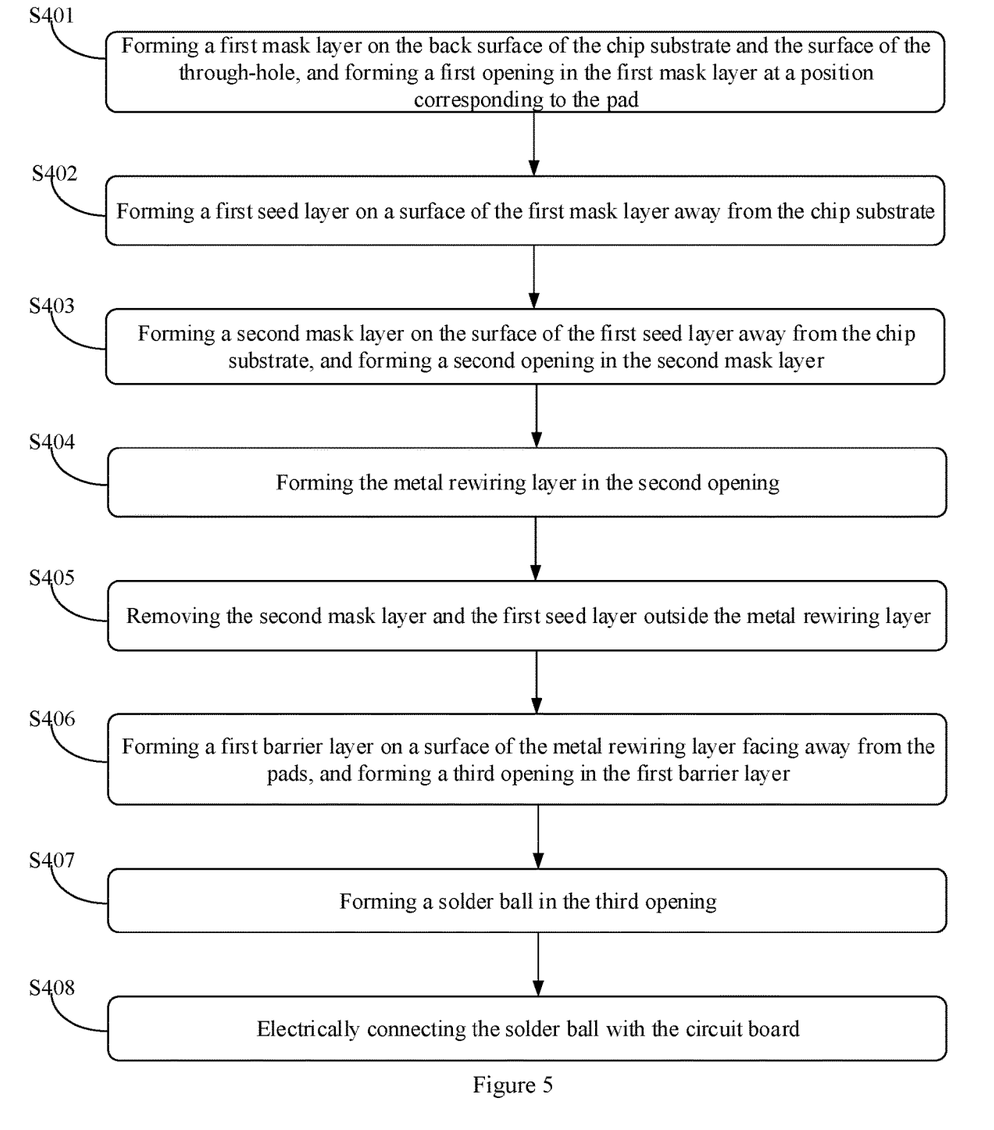
FIG. 5 illustrates a schematic flowchart of a step S103 in FIG. 1 consistent with various disclosed embodiments of the present disclosure.

FIG. 5 illustrates a schematic flowchart of the step S103 in FIG. 1 consistent with various disclosed embodiments of the present disclosure. In one embodiment, referring to FIGS. 4A-4I and FIG. 5, the above step S103 may include following.

In S401: forming a first mask layer 22 on the back surface 16 of the chip substrate 10 and the surface of the through-hole 20, and forming a first opening 220 in the first mask layer 22 at a position corresponding to the pad 102.

Specifically, referring to FIG. 4B, in one embodiment, the first mask layer 22 may be first coated on the back surface 16 of the chip substrate 10 and the surface of the through-hole 20, and then the first opening 220 may be formed in the first mask layer 22 at a position corresponding to the pad 102 by exposure and development processes or any other method, to expose the pad 102. In one embodiment, the first mask layer 22 may be made of one or more of photoresist, silicon oxide, silicon nitride, and amorphous carbon.

In S402: forming a first seed layer 24 on a surface of the first mask layer 22 away from the chip substrate 10.

Specifically, referring to FIG. 4C, the first seed layer 24 may be made of one or more of titanium, aluminum, copper, gold, and silver. Forming the first seed layer 24 may include a sputtering process, or a physical vapor deposition process.

In S403: forming a second mask layer 26 on the surface of the first seed layer 24 away from the chip substrate 10, and forming a second opening 260 in the second mask layer 26.

Specifically, referring to FIG. 4D, in one embodiment, the second mask layer 26 may be first coated on the surface of the first seed layer 24 away from the chip substrate 10, and then the second opening 260 may be formed in the second mask layer 26 by exposure and development processes or any other method. The second opening 260 may be formed above the pad 102. In one embodiment, the second mask layer 26 may be made of one or more of photoresist, silicon oxide, silicon nitride, and amorphous carbon.

In S404: forming the metal rewiring layer 28 in the second opening 260.

Specifically, referring to FIG. 4E, in one embodiment, the metal rewiring layer 28 may be formed in the second opening 260 by an electroplating process. The metal rewiring layer 28 may be made of copper or any other suitable metal. In one embodiment, a height of the metal rewiring layer 28 may be the same as a depth of the second opening 260. In certain embodiments, the height of the metal rewiring layer 28 may be less than the depth of the second opening 260.

In S405: removing the second mask layer 26 and the first seed layer 24 outside the metal rewiring layer 28.

Specifically, referring to FIG. 4F, in one embodiment, the second mask layer 26 may be removed by a photolithography process to expose the first seed layer 24. The exposed portion of the first seed layer 24 may be removed by a wet etching process or a dry etching process, and merely the first seed layer 24 below the metal rewiring layer 28 may be retained. The pad 102, the first seed layer 24, and the metal rewiring layer 28 may be electrically connected to each other.

In S406: forming a first barrier layer 21 on a surface of the metal rewiring layer 28 facing away from the pads 102, and forming a third opening 210 in the first barrier layer 21.

Specifically, referring to FIG. 4G, the first barrier layer 21 may be made of an insulating material. In one embodiment, the third opening 210 may be formed in the first barrier layer 21 by a photolithography process or any other etching method.

In S407: forming a solder ball 23 in the third opening 210.

Specifically, referring to FIG. 4H, the solder ball 23 may be directly formed in the third opening 210. For example, the solder ball 23 may be placed in the third opening 210 by using a ball placement device. The solder ball 23 may be made of tin or tin alloy. The solder ball 23 may be electrically connected to the metal rewiring layer 28. In another embodiment, an under-ball metal layer may be formed on the metal rewiring layer 28, and then the ball may be placed on the under-ball metal layer, which may not be limited by the present disclosure.

For example, a second seed layer may be formed on a surface of the first barrier layer away from the pad. The second seed layer may be formed by a sputtering method. A titanium layer may be first formed, and then a copper layer may be sputtered on the titanium layer. A third mask layer may be formed on the surface of the second seed layer away from the pad, and a fourth opening may be formed in the third mask layer at a position corresponding to the third opening. The under-ball metal layer may be formed in the fourth opening. The under-ball metal layer may be made of copper, and may be formed by an electroplating process. The third mask layer and the corresponding second seed layer under the third mask layer may be removed. The solder ball may be formed at a position corresponding to the under-ball metal layer. The solder ball may be formed by dropping a ball at a position corresponding to the under-ball metal layer by the ball placement device, and reflowing the ball. The solder ball, the under-ball metal layer, the second seed layer, and the metal rewiring layer may be electrically connected to each other.

In S408: electrically connecting the solder ball 23 with the circuit board 25.

Specifically, referring to FIG. 4I, the solder ball 23 may be electrically connected to the circuit board 25 by a thermal reflow process. When the substrate is provided on the side of the transparent protection layer 18 away from the chip substrate, after performing the step S408, the packaging method may further include removing the substrate.

The chip may be electrically connected to the circuit board 25 through the above processes. In certain embodiments, the chip may be electrically connected to the circuit board 25 through any other method. For example, after the metal rewiring layer 28 is formed, the metal rewiring layer 28 may be directly electrically connected to the circuit board 25.

In another embodiment, to enhance the waterproof performance of the semiconductor package device, after performing the step S103, the method may further include filling the region between the transparent protection layer 18 and the circuit board 25 with a molding compound, to form a molding layer. The molding layer may not cover the transparent protection layer 18 corresponding to the photosensitive region 100 of the chip. For example, a protection adhesive film may be provided on the side of the transparent protection layer 18 close to the circuit board 25, to control the height of the molding layer, such that a distance between the molding layer and the circuit board 25 may be equal to or less than a distance between the transparent protection layer 18 and the circuit board.

Figure 6:
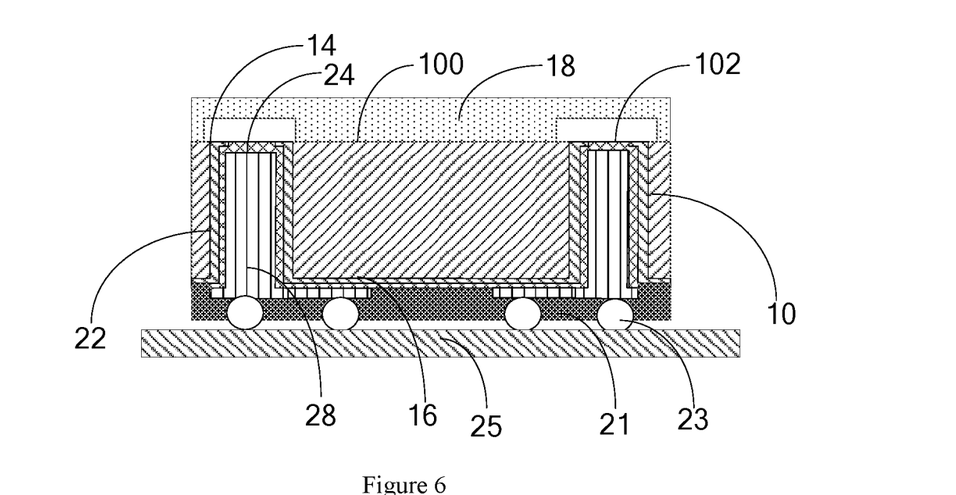
FIG. 6 illustrates a schematic diagram of an exemplary semiconductor package device consistent with various disclosed embodiments of the present disclosure.

The present disclosure also provides a semiconductor package device. The semiconductor package device may be formed by the above-disclosed semiconductor packaging method. FIG. 6 illustrates a schematic diagram of a semiconductor package device consistent with various disclosed embodiments of the present disclosure. Referring to FIG. 6, the semiconductor package device may include a chip substrate, pads, a transparent protection layer, and a circuit board.

The chip substrate 10 may have a front surface 14 and a back surface 16, and the front surface 14 may include a photosensitive region 100. The pads 102 may be disposed at the front surface 14 of the chip substrate 10 and around the photosensitive region 100. The chip substrate 10 may contain through-holes (not labeled) at positions corresponding to the pads 102, and the through-holes may one-to-one correspond to the pads 102. In one embodiment, the through-holes may be formed by a plasma etching process. The through-hole may have a uniform size from a side of the pad 102 to the back surface 16 of the chip substrate 10. In another embodiment, the size of the through-hole may gradually increase from the side of the pad 102 to the back surface 16 of the chip substrate 10. All or part of each pad 102 may be exposed from a corresponding through-hole.

The transparent protection layer 18 may be disposed over the front surface 14 of the chip substrate 10, and may cover the photosensitive region 100 and the pads 102 on each chip substrate. Specifically, the transparent protection layer 18 may be formed by spin coating, dispensing or printing. The transparent protection layer 18 may be made of a material capable of being cured by an ultraviolet irradiation or a baking, e.g., an inorganic transparent material or an organic transparent material, which may not be limited by the present disclosure.

The circuit board 25 may be electrically connected to each pad 102 of the chip through a metal rewiring layer 28 in the corresponding through-hole. Specifically, referring to FIG. 6, the metal rewiring layer 28 may be disposed over the back surface 16 of the chip substrate 10 and may be extended into the through-hole. One end of the metal rewiring layer 28 may be electrically connected to the pad 102, and another end of the metal rewiring layer 28 may be electrically connected to the circuit board 25.

In another embodiment, referring to FIG. 6, the semiconductor package device may further include a first mask layer 22 disposed between the back surface 16 of the chip substrate 10 and the metal rewiring layer 28, where the first mask layer 22 may contain a first opening (not labeled) at a position corresponding to the pad 102. The semiconductor package device may further include a first seed layer 24 disposed between the first mask layer 22 and the metal rewiring layer 28. The pad 102, the first seed layer 24, and the metal rewiring layer 28 may be electrically connected to each other.

In another embodiment, the chip may be electrically connected to the circuit board 25 by providing a solder ball 23. Referring to FIG. 6, the semiconductor package device may further include a first barrier layer 21 disposed on the side of the metal rewiring layer 28 away from the pad 102, where the first barrier layer 21 may contain a third opening (not labeled). The semiconductor package device may further include the solder ball 23 disposed in the third opening and electrically connected with the metal rewiring layer 28 and the circuit board 25.

Figure 7:
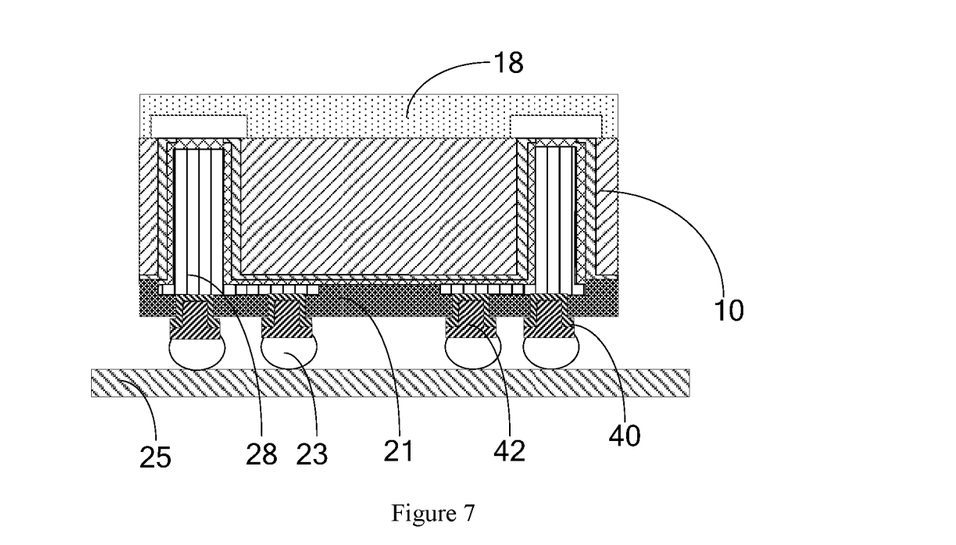
FIG. 7 illustrates a schematic diagram of another exemplary semiconductor package device consistent with various disclosed embodiments of the present disclosure.

In another embodiment, the solder ball may be disposed by any other method, e.g., providing an under-ball metal layer. FIG. 7 illustrates a schematic diagram of another semiconductor package device consistent with various disclosed embodiments of the present disclosure. The same or similar features between the embodiments associated with FIG. 7 and the embodiments associated with FIG. 6 may not be repeated herein. Specifically, referring to FIG. 7, the semiconductor package device may further include a first barrier layer 21 disposed on the side of the metal rewiring layer 28 away from the pad 102, where the first barrier layer 21 may contain a third opening (not labeled). Moreover, the semiconductor package device may include a second seed layer 40 disposed on the side of the first barrier layer 21 away from the pad 102 and covering the third opening. In addition, the semiconductor package device may include an under-ball metal layer 42 disposed on the side of the second seed layer 40 away from the pad 102. Further, the semiconductor package device may include a solder ball 23 disposed on the side of the under-ball metal layer 42 away from the pad 102. The solder ball 23, the under-ball metal layer 42, the second seed layer 40, and the metal rewiring layer 28 may be electrically connected to each other.

Accordingly, in the present disclosure, the transparent protection layer may be directly formed over the front surface of the chip substrate. On the one hand, the thickness of the transparent protection layer may be controlled. Compared with the traditional method where a transparent glass is provided, the thickness of the transparent protection layer may be less than the thickness of the transparent glass, which may reduce refraction, reflection and energy loss of light, and may improve the photosensitive effect of the chip. On the other hand, because the transparent protection layer is directly formed over the front surface of the chip substrate, the transparent protection layer may have a substantially low probability of being separated from the front surface of the chip substrate, thereby reducing the dust-free requirements for the use environment.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor package device, comprising:
a chip substrate, having a front surface and a back surface, wherein the front surface includes a photosensitive region;
pads, disposed at the front surface of the chip substrate and around the photosensitive region, wherein the chip substrate contains through-holes at positions corresponding to the pads, and the through-holes one-to-one correspond to the pads;
a transparent protection layer, disposed over the front surface of the chip substrate and covering the photosensitive region and the pads;
a circuit board, electrically connected to each pad through a metal rewiring layer in a corresponding through-hole, wherein the metal rewiring layer is disposed over the back surface of the chip substrate and extended into the through-hole, and one end of the metal rewiring layer is electrically connected to the pad, and another end of the metal rewiring layer is electrically connected to the circuit board;
a first mask layer, disposed between the back surface of the chip substrate and the metal rewiring layer, wherein the first mask layer contains a first opening at a position corresponding to the pad; and
a first seed layer, disposed between the first mask layer and the metal rewiring layer, wherein the pad, the first seed layer, and the metal rewiring layer are electrically connected to each other.

2. The device according to claim 1, wherein:
the transparent protection layer is formed by spin coating, dispensing or printing.

3. The device according to claim 1, wherein:
the transparent protection layer is made of a material capable of being cured by an ultraviolet irradiation or a baking.

4. The device according to claim 1, wherein:
the transparent protection layer is made of a material including one or more of an inorganic transparent material and an organic transparent material, wherein the inorganic transparent material includes at least one of silicon nitride and silicon oxynitride, and the organic transparent material includes polysiloxane.

5. The device according to claim 1, wherein:
a size of the through-hole is uniform from a side at the pad to the back surface of the chip substrate.

6. The device according to claim 1, wherein:
a size of the through-hole gradually increases from a side at the pad to the back surface of the chip substrate.

7. The device according to claim 1, further including:
a first barrier layer, disposed on a side of the metal rewiring layer away from the pads, wherein the first barrier layer contains a third opening, and
a solder ball, disposed in the third opening and electrically connecting the metal rewiring layer with the circuit board.

8. The device according to claim 1, further including:
a first barrier layer, disposed on a side of the metal rewiring layer away from the pads, wherein the first barrier layer contains a third opening,
a second seed layer, disposed on a side of the first barrier layer away from the pads and covering the third opening,
an under-ball metal layer, disposed on a side of the second seed layer away from the pads, and
a solder ball, disposed on a side of the under-ball metal layer away from the pads, wherein the solder ball, the under-ball metal layer, the second seed layer, and the metal rewiring layer are electrically connected to each other.

9. A semiconductor packaging method, comprising:
providing a chip, wherein the chip includes:
a chip substrate having a front surface and a back surface, wherein the front surface includes a photosensitive region,
pads disposed at the front surface of the chip substrate and around the photosensitive region, and
a transparent protection layer over the front surface of the chip substrate, wherein the transparent protection layer covers the photosensitive region and the pads;
forming through-holes in the chip substrate at positions corresponding to the pads from the back surface of the chip substrate, wherein the pads one-to-one correspond to the through-holes and are exposed from the through-holes;
electrically connecting each pad of the chip to a circuit board through a metal rewiring layer in a corresponding through-hole, wherein one end of the metal rewiring layer is electrically connected to the pad, and another end of the metal rewiring layer is electrically connected to the circuit board;
forming a first mask layer between the back surface of the chip substrate and the metal rewiring layer, wherein the first mask layer contains a first opening at a position corresponding to the pad; and
forming a first seed layer between the first mask layer and the metal rewiring layer, wherein the pad, the first seed layer, and the metal rewiring layer are electrically connected to each other.

10. The method according to claim 9, wherein providing the chip includes:
providing a wafer, wherein:
the wafer contains a plurality of chip substrates arranged in a matrix, and a dicing groove is formed between adjacent chip substrates of the plurality of chip substrates,
the wafer has a front surface and a back surface, the front surface of the wafer is the front surface of the chip substrate, and the back surface of the wafer is the back surface of the chip substrate, and
the photosensitive region and the pads disposed around the photosensitive region are disposed over the front surface of the chip substrate;
forming the transparent protection layer over the front surface of the wafer, wherein the transparent protection layer covers the photosensitive region and the pads on each chip substrate; and
cutting the wafer and the transparent protection layer along the dicing groove, to obtain a plurality of single chips.

11. The method according to claim 9, wherein the transparent protection layer is formed by:
forming a transparent protection film over the front surface of the chip substrate by spin coating, dispensing or printing, and
curing the transparent protection film to form the transparent protection layer.

12. The method according to claim 11, wherein curing the transparent protection film includes:
an ultraviolet irradiation, or a high-temperature baking.

13. The method according to claim 9, before forming the through-holes in the chip substrate at the positions corresponding to the pads from the back surface of the chip substrate, further including:
providing a substrate on a side of the transparent protection layer away from the chip substrate; and
polishing the back surface of the chip substrate to make the chip substrate have a thickness less than or equal to a predetermined thickness.

14. The method according to claim 9, wherein forming the through-holes in the chip substrate at the positions corresponding to the pads from the back surface of the chip substrate includes:
flipping the chip substrate, and
forming the through-holes in the chip substrate at the positions corresponding to the pads from the back surface of the chip substrate, wherein all or part of each pad is exposed from a corresponding through-hole.

15. The method according to claim 14, wherein:
a size of the through-hole is uniform from a side at the pad to the back surface of the chip substrate, or
the size of the through-hole gradually increases from the side at the pad to the back surface of the chip substrate.

16. The method according to claim 9, wherein
forming the metal rewiring layer in the corresponding through-hole includes:
forming a second mask layer on a surface of the first seed layer away from the chip substrate, and forming a second opening in the second mask layer above the pad,
forming the metal rewiring layer in the second opening, and
removing the second mask layer and the first seed layer outside the metal rewiring layer.

17. The method according to claim 16, wherein after removing the second mask layer and the first seed layer outside the metal rewiring layer, further including:
forming a first barrier layer on a surface of the metal rewiring layer facing away from the pads, and forming a third opening in the first barrier layer, and
forming a solder ball in the third opening, and electrically connecting the solder ball with the circuit board.

* * * * *